(12) United States Patent
Zheng (10) Patent No.: US 11,043,541 B2
(45) Date of Patent: Jun. 22, 2021

(54) OLED DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Yuan Zheng, Wuhan (CN)

( * ) Notice: Subject to any disclaimer, the term of this patent is extended or adjusted under 35 U.S.C. 154(b) by 32 days.

(21) Appl. No.: 16/630,866

(22) PCT Filed: Aug. 5, 2019

(86) PCT No.: PCT/CN2019/099277
§ 371 (c)(1),
(2) Date: Jan. 14, 2020

(87) PCT Pub. No.: WO2021/007890
PCT Pub. Date: Jan. 21, 2021

(65) Prior Publication Data
US 2021/0020701 A1   Jan. 21, 2021

(30) Foreign Application Priority Data
Jul. 16, 2019 (CN) .......................... 201910638951.4

(51) Int. Cl.
*H01L 27/32* (2006.01)
*H01L 29/786* (2006.01)
*H01L 51/52* (2006.01)

(52) U.S. Cl.
CPC ........ *H01L 27/323* (2013.01); *H01L 27/3276* (2013.01); *H01L 29/786* (2013.01); *H01L 51/5237* (2013.01)

(58) Field of Classification Search
CPC . H01L 27/323; H01L 27/3276; H01L 29/786; H01L 51/5237; G06F 3/044
See application file for complete search history.

(56) References Cited

U.S. PATENT DOCUMENTS 9,921,695 B2 * 3/2018 Chen ..................... G06F 3/0445

* cited by examiner

*Primary Examiner* — Kyoung Lee (57) ABSTRACT

In an OLED display device, a light emitting functional layer includes light emitting points arranged in an array inside a light transmissive region. Each light emitting point includes corresponding light emitting units arranged in an array. A touch layer includes touch electrodes arranged in an array. The touch electrodes disposed correspondingly to the light transmissive region include a first portion. The first portion includes sensing blocks and sensing traces arranged in an array. Adjacent two of the sensing blocks in a same row or a same column of the sensing blocks are connected to each other through at least one of the sensing traces. Each sensing block is disposed above the corresponding light emitting point. Each sensing block has a corresponding grid structure. A corresponding projection of each sensing block in a vertical direction is located outside the corresponding light emitting units of the corresponding light emitting point.

10 Claims, 5 Drawing Sheets

OLED DISPLAY DEVICE

FIELD OF INVENTION

The present disclosure relates to a technical field of displays, and more particularly to an organic light emitting diode (OLED) display device.

BACKGROUND OF INVENTION

In a technical field of displays, flat panel display devices such as organic light emitting diode (OLED) display devices have advantages of having thin bodies, being power saving, and having no radiation, have been widely used, and have gradually replaced cathode ray tube (CRT) display devices. OLEDs generally include substrates, anodes disposed on substrates, hole injection layers (HILs) disposed on anodes, hole transporting layers (HTLs) disposed on HILs, emissive layers (EMLs) disposed on HTLs, electron transporting layers (ETLs) disposed on EMLs, electron injection layers (EILs) disposed on ETLs, and cathodes disposed on ETLs. A light emission principle of OLED devices is that semiconductor materials and organic luminescent materials are driven by electric fields, causing luminescence by carrier injection and recombination.

An existing OLED display device that uses a direct on-cell touch (DOT) technology (i.e., a touch layer is directly disposed on an OLED panel) includes a glass substrate, a polyimide (PI) film, a thin film transistor (TFT) array layer, a light emitting functional layer, a thin film encapsulation layer, and a touch layer disposed in sequence. The touch layer includes a plurality of touch electrodes arranged in an array. The touch electrodes includes a plurality of transmitting electrodes and a plurality of receiving electrodes alternately arranged in sequence. Each adjacent two of the receiving electrodes is directly connected to each other. Each adjacent two of the transmitting electrodes is connected to each other through a corresponding bridge disposed in a layer different from the touch electrodes. Therefore, a touch function is achieved.

With continuous development of display technologies, display devices with full screen designs are more and more popular among consumers. In order to realize full screen designs, camera under panel (CUP) technologies have begun to appear in visual fields of people. For the so-called CUP technologies, cameras are disposed on backs of OLED display panels. At the same time, light transmissive regions corresponding to cameras are disposed in OLED display panels. When cameras are not used, light transmissive regions may normally perform displaying and touching. When cameras are used, light may enter cameras through light transmissive regions for imaging. Therefore, light transmissive regions not only need pixel units that may perform displaying, but also need to have higher transmission percentages. In an existing OLED display device that uses the CUP technology and the DOT technology at the same time, a touch layer inside a light transmissive region severely impacts a transmission percentage of the light transmissive region.

SUMMARY OF INVENTION

An object of the present disclosure is to provide an organic light emitting diode (OLED) device that can increase a transmission percentage of a light transmissive region while ensuring that a touch function of the light transmissive region is normal.

In order to achieve the aforementioned object, the present disclosure provides an OLED display device including: a substrate, a light emitting functional layer, and a touch layer disposed in sequence;

wherein the substrate includes a light transmissive region and a display region adjacent to the light transmissive region; wherein the light emitting functional layer includes a plurality of light emitting points arranged in an array inside the light transmissive region, and each light emitting point includes a plurality of corresponding light emitting units arranged in an array; wherein the touch layer includes a plurality of touch electrodes arranged in an array; and wherein the touch electrodes include a plurality of transmitting electrodes and a plurality of receiving electrodes alternately arranged in sequence, and each adjacent transmitting electrode and receiving electrode of the transmitting electrodes and the receiving electrodes are spaced apart from each other; and wherein the touch electrodes disposed correspondingly to the light transmissive region include a first portion; wherein the first portion includes a plurality of sensing blocks and a plurality of sensing traces arranged in an array inside the light transmissive region; wherein adjacent two of the sensing blocks in a same row of the sensing blocks are connected to each other through at least one of the sensing traces; wherein adjacent two of the sensing blocks in a same column of the sensing blocks are connected to each other through at least one of the sensing traces; and wherein each sensing block is disposed above the corresponding light emitting point, each sensing block has a corresponding grid structure, and a corresponding projection of each sensing block in a vertical direction is located outside the corresponding light emitting units of the corresponding light emitting point.

In adjacent two of the touch electrodes disposed correspondingly to the light transmissive region, the sensing blocks in the first portion of one of the adjacent two of the touch electrodes closest to the sensing blocks of another of the adjacent two of the touch electrodes are disposed in one-to-one correspondence with the sensing blocks in the first portion of the another of the adjacent two of the touch electrodes closest to the sensing blocks of the one of the adjacent two of the touch electrodes, and correspondingly disposed two of the sensing blocks are located above a same one of the light emitting points.

In adjacent two of the touch electrodes disposed correspondingly to the light transmissive region, the corresponding first portion of each of the adjacent two of the touch electrodes is provided with a plurality of corresponding extensions close to a corresponding edge set of corresponding another of the adjacent two of the touch electrodes; wherein a corresponding end of each extension is connected to a corresponding one of the sensing blocks, and corresponding another end of each extension extends in a direction away from the corresponding first portion of the corresponding one of the adjacent two of the touch electrodes where each extension is located; wherein each extension includes a plurality of corresponding parallel spaced extension traces; wherein the corresponding extension traces of each extension have different lengths; wherein the corresponding extensions of the corresponding first portion of each of the adjacent two of the touch electrodes are in one-to-one correspondence with the corresponding extensions of the corresponding first portion of the corresponding another of the adjacent two of the touch electrodes; and wherein the extension traces of one of two corresponding extensions are disposed correspondingly opposite to the extension traces of another of the two corresponding extensions.

The one of the sensing blocks has a grid line having a width smaller than a width of one of the corresponding at least one of the sensing traces, and one of the corresponding extension traces has a width same as the width of the one of the corresponding at least one of the sensing traces.

An angle between a row direction of the corresponding light emitting units of each light emitting point and a row direction of the sensing blocks in the first portion is 45°;

the row direction of the corresponding light emitting units of each light emitting point is same as a row direction of the touch electrodes;

an extending direction of each sensing trace is same as a corresponding direction of the sensing blocks in the first portion, wherein the corresponding direction of the sensing blocks is a row direction or a column direction; and an extending direction of each extension trace is same as a column direction of the sensing blocks in the first portion.

The touch electrodes disposed correspondingly to the light transmissive region further includes a second portion located inside the display region and is connected to the first portion; and wherein the second portion has a plurality of first openings arranged in an array.

All of a plurality of corresponding edge sets of the touch electrodes located outside the light transmissive region have a plurality of corresponding zigzag structures; and wherein outside the light transmissive region, the corresponding edge sets of any adjacent two of the touch electrodes match each other.

Each of the touch electrodes except the touch electrodes disposed correspondingly to the light transmissive region has a plurality of corresponding second openings arranged in an array.

The OLED display device further includes a thin film transistor (TFT) array layer disposed between the light emitting functional layer and the substrate, and a thin film encapsulation layer disposed between the light emitting functional layer and the touch layer.

The TFT array layer includes a plurality of array traces, and the first portion is located above the array traces.

Advantages of the present disclosure are as follows. The light emitting functional layer of the OLED display device of the present disclosure includes the light emitting points arranged in the array inside the light transmissive region. Each light emitting point includes the corresponding light emitting units arranged in the array. The touch layer includes the touch electrodes arranged in the array. The touch electrodes disposed correspondingly to the light transmissive region include the first portion. The first portion includes the sensing blocks and the sensing traces arranged in the array. Adjacent two of the sensing blocks in the same row of the sensing blocks are connected to each other through the at least one of the sensing traces. Adjacent two of the sensing blocks in the same column of the sensing blocks are connected to each other through the at least one of the sensing traces. Each sensing block is disposed above the corresponding light emitting point. Each sensing block has the corresponding grid structure. The corresponding projection of each sensing block in the vertical direction is located outside the corresponding light emitting units of the corresponding light emitting point. The present disclosure can increase the transmission percentage of the light transmissive region while ensuring that the touch function of the light transmissive region is normal.

DESCRIPTION OF DRAWINGS

In order to further understand features and technical content of the present disclosure, please refer to the detail description and the drawings of the present disclosure below. However, the drawings are only used for reference and for illustration, and are not used to limit the present disclosure.

DETAILED DESCRIPTION OF PREFERRED EMBODIMENTS

In order to further describe technical means used by the present disclosure and effects thereof, preferred embodiments of the present disclosure are described in detail below in conjunction with the drawings thereof.

Referring to FIGS. 1 to 5, the present disclosure provides an organic light emitting diode (OLED) display device including: a substrate 10, a light emitting functional layer 20, and a touch layer 30 disposed in sequence.

Figure 1:
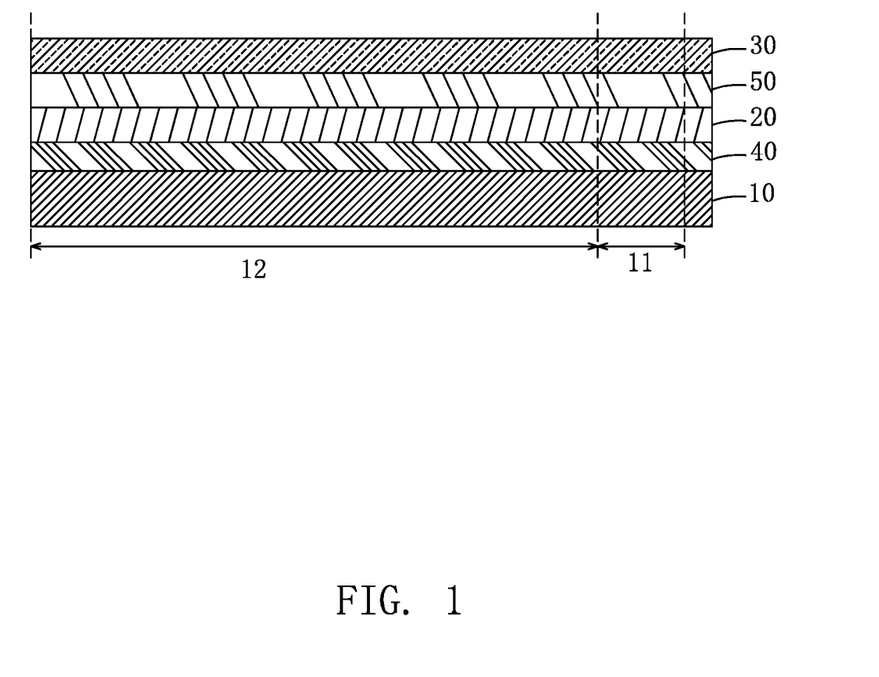
FIG. 1 is a schematic structural diagram of a cross-sectional view of an organic light emitting diode (OLED) display device of the present disclosure.
Figure 2:
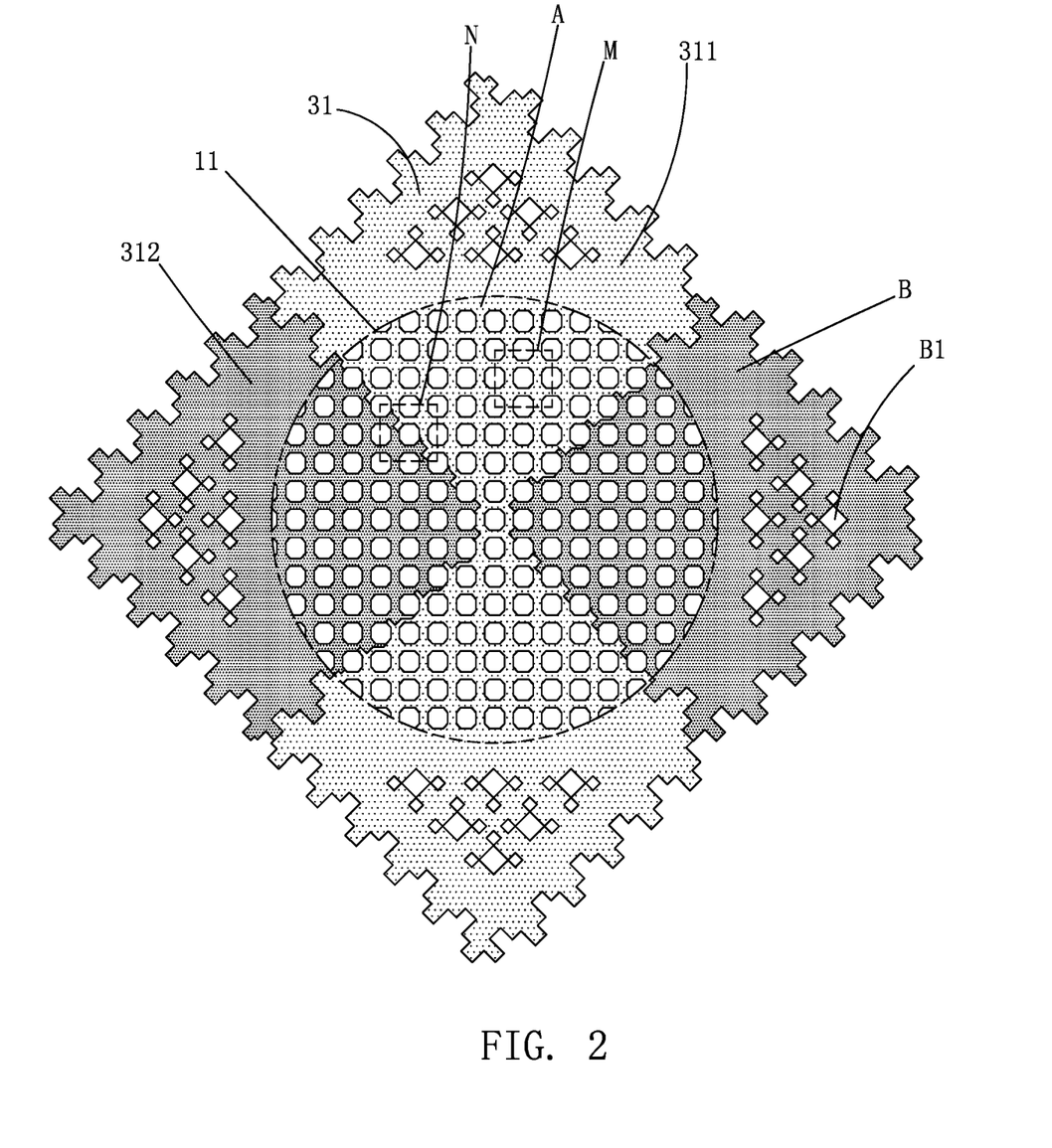
FIG. 2 is a schematic diagram of a partial top-view of the OLED display device of the present disclosure illustrating a light transmissive region.

The substrate 10 includes a light transmissive region 11 and a display region 12 adjacent to the light transmissive region 11. The light emitting functional layer 20 includes a plurality of light emitting points 21 arranged in an array inside the light transmissive region 11, and each light emitting point 21 includes a plurality of corresponding light emitting units 211 arranged in an array. The touch layer 30 includes a plurality of touch electrodes 31 arranged in an array. The touch electrodes 31 include a plurality of transmitting electrodes 311 and a plurality of receiving electrodes 312 alternately arranged in sequence, and each adjacent transmitting electrode 311 and receiving electrode 312 of the transmitting electrodes 311 and the receiving electrodes 312 are spaced apart from each other.

Figure 4:
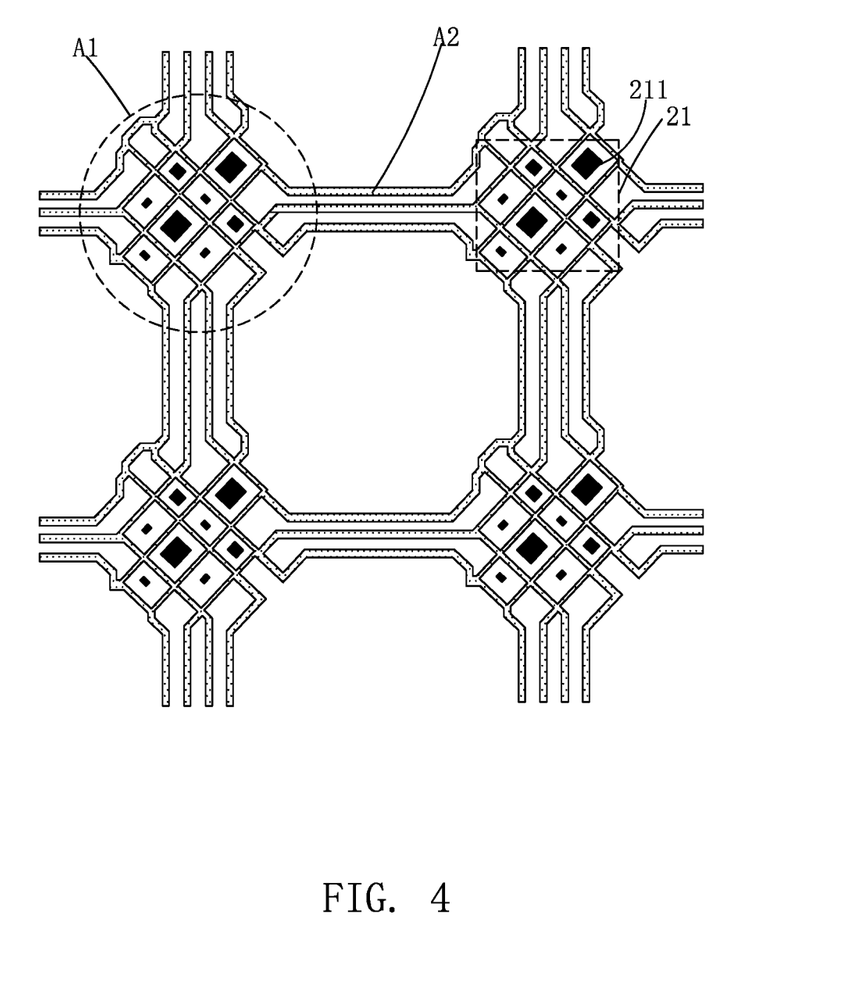
FIG. 4 is a schematic diagram of an enlarged view of a portion M in FIG. 2.

The touch electrodes 31 disposed correspondingly to the light transmissive region 11 include a first portion A. The first portion A includes a plurality of sensing blocks A1 and a plurality of sensing traces A2 arranged in an array inside the light transmissive region 11. Adjacent two of the sensing blocks A1 in a same row of the sensing blocks A1 are connected to each other through at least one of the sensing traces A2. Adjacent two of the sensing blocks A1 in a same column of the sensing blocks A1 are connected to each other through at least one of the sensing traces A2. Each sensing block A1 is disposed above the corresponding light emitting point 21, each sensing block A1 has a corresponding grid structure, and a corresponding projection of each sensing block A1 in a vertical direction is located outside the corresponding light emitting units 211 of the corresponding light emitting point 21.

Figure 5:
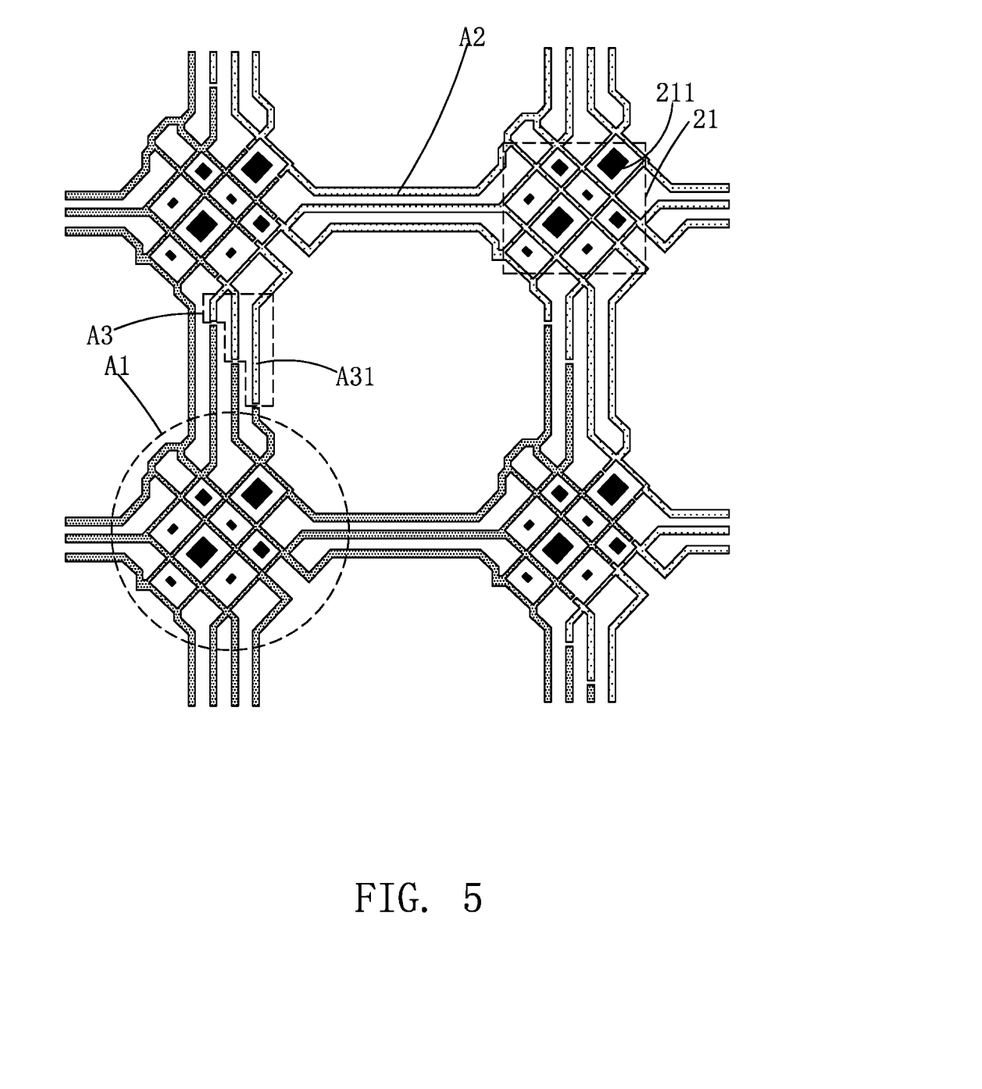
FIG. 5 is a schematic diagram of an enlarged view of a portion N in FIG. 2.

Specifically, in conjunction with FIG. 5, in adjacent two of the touch electrodes 31 disposed correspondingly to the light transmissive region 11, the sensing blocks A1 in the first portion A of one of the adjacent two of the touch electrodes 31 closest to the sensing blocks A1 of another of the adjacent two of the touch electrodes 31 are disposed in one-to-one correspondence with the sensing blocks A1 in the first portion A of the another of the adjacent two of the touch electrodes 31 closest to the sensing blocks A1 of the one of the adjacent two of the touch electrodes 31, and correspondingly disposed two of the sensing blocks A1 are located above a same one of the light emitting points 21.

Specifically, in conjunction with FIG. 5, in adjacent two of the touch electrodes 31 disposed correspondingly to the light transmissive region 11, the corresponding first portion A of each of the adjacent two of the touch electrodes 31 is provided with a plurality of corresponding extensions A3 close to a corresponding edge set of corresponding another of the adjacent two of the touch electrodes 31. A corresponding end of each extension A3 is connected to a corresponding one of the sensing blocks A1, and corresponding another end of each extension A3 extends in a direction away from the corresponding first portion A of the corresponding one of the adjacent two of the touch electrodes 31 where each extension A3 is located. Each extension A3 includes a plurality of corresponding parallel spaced extension traces A31. The corresponding extension traces A31 of each extension A3 have different lengths. The corresponding extensions A3 of the corresponding first portion A of each of the adjacent two of the touch electrodes 31 are in one-to-one correspondence with the corresponding extensions A3 of the corresponding first portion A of the corresponding another of the adjacent two of the touch electrodes 31. The extension traces A31 of one of two corresponding extensions A3 are disposed correspondingly opposite to the extension traces A31 of another of the two corresponding extensions A3. Thus, capacitance formed by the adjacent two of the touch electrodes 31 disposed correspondingly to the light transmissive region 11 is enhanced.

Preferably, the one of the sensing blocks A1 has a grid line having a width smaller than a width of one of the corresponding at least one of the sensing traces A2. One of the corresponding extension traces A31 has a width same as the width of the one of the corresponding at least one of the sensing traces A2. Therefore, a trace density of the first portion A can be increased.

Preferably, referring to FIGS. 2 and 4, an angle between a row direction of the corresponding light emitting units 211 of each light emitting point 21 and a row direction of the sensing blocks A1 in the first portion A is 45°. The row direction of the corresponding light emitting units 211 of each light emitting point 21 is same as a row direction of the touch electrodes 21. An extending direction of each sensing trace A2 is same as a corresponding direction of the sensing blocks A1 in the first portion A, wherein the corresponding direction of the sensing blocks A1 is a row direction or a column direction. An extending direction of each extension trace A31 is same as a column direction of the sensing blocks A1 in the first portion A.

Specifically, referring to FIG. 2, the touch electrodes 31 disposed correspondingly to the light transmissive region 11 further includes a second portion B located inside the display region 12 and is connected to the first portion A. The second portion B has a plurality of first openings B1 arranged in an array.

Figure 3:
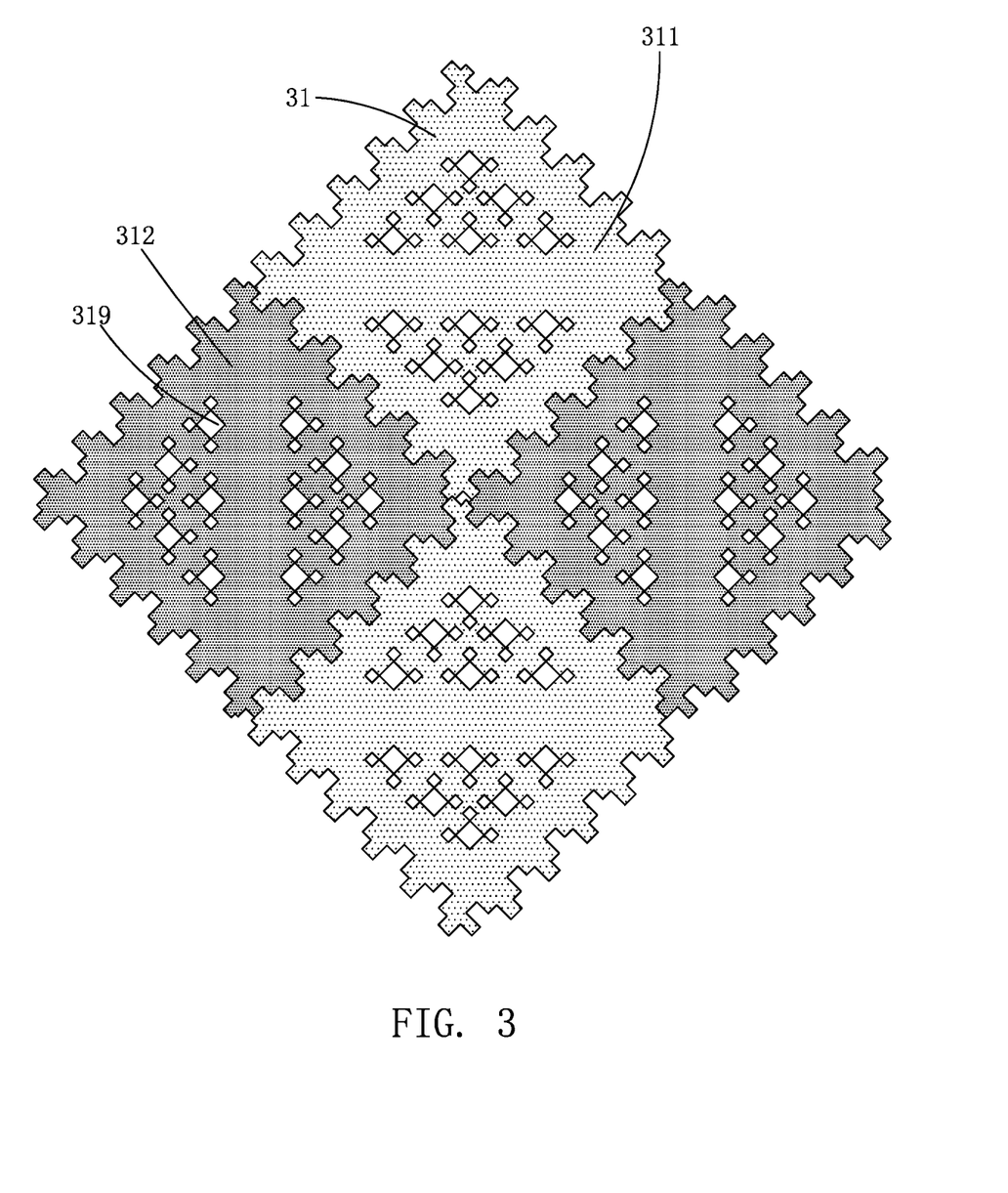
FIG. 3 is a schematic diagram of a partial top-view of the OLED display device of the present disclosure illustrating a display region.

Specifically, referring to FIGS. 2 and 3, all of a plurality of corresponding edge sets of the touch electrodes 31 located outside the light transmissive region 11 have a plurality of corresponding zigzag structures. Outside the light transmissive region 11, a plurality of corresponding edge sets of any adjacent two of the touch electrodes 31 match each other.

Hence, capacitance formed by the any adjacent two of the touch electrodes 31 is enhanced.

Specifically, referring to FIG. 3, each of the touch electrodes 31 except the touch electrodes 31 disposed correspondingly to the light transmissive region 11 has a plurality of corresponding second openings 319 arranged in an array.

Specifically, referring to FIG. 1, the OLED display device further includes a thin film transistor (TFT) array layer 40 disposed between the light emitting functional layer 20 and the substrate 10, and a thin film encapsulation layer 50 disposed between the light emitting functional layer 20 and the touch layer 30. Further, the TFT array layer 40 includes a plurality of array traces (not illustrated). The array traces specifically include a plurality of data lines and a plurality of scan lines, and the like also disposed in a TFT array layer in the related art. The first portion A is located above the array traces, to maximize a transmission percentage of the light transmissive region 11 of the OLED display device.

Specifically, the substrate 10 may include a rigid layer and a flexible layer (not illustrated) disposed in sequence. Material of the rigid layer may be glass. Material of the flexible layer may be polyimide.

Specifically, the light emitting functional layer 20 includes a hole injection layer, a hole transporting layer, an emissive layer, an electron transporting layer, and an electron injection layer disposed in sequence.

Further, a pixel defining layer (not illustrated) is disposed on the TFT array layer 40. The pixel defining layer is provided with a plurality of pixel defining grooves located inside the light transmissive region 11. The light emitting units 211 are located inside the corresponding pixel defining grooves.

It is to be noted that the light emitting functional layer 20 of the OLED display device of the present disclosure includes a plurality of light emitting points 21 arranged in an array inside the light transmissive region 11. Each light emitting point 21 includes the corresponding light emitting units 211 arranged in an array. Each light emitting point includes the corresponding light emitting units arranged in an array. The touch layer 30 includes the touch electrodes 31 arranged in an array. The touch electrodes 31 disposed correspondingly to the light transmissive region 11 include a first portion A. The first portion A includes a plurality of sensing blocks A1 and a plurality of sensing traces A2 arranged in an array inside the light transmissive region 11. Adjacent two of the sensing blocks A1 in a same row of the sensing blocks A1 are connected to each other through at least one of the sensing traces A2. Adjacent two of the sensing blocks A1 in a same column of the sensing blocks A1 are connected to each other through at least one of the sensing traces A2. Each sensing block A1 is disposed above the corresponding light emitting point 21, each sensing block A1 has a corresponding grid structure, and a corresponding projection of each sensing block A1 in a vertical direction is located outside the corresponding light emitting units 211 of the corresponding light emitting point 21. Therefore, the touch electrodes 31 disposed correspondingly to the light transmissive region 11 reduces virtual pattern designs, and ensures capacitance between each transmitting electrode 311 and the corresponding receiving electrode 312. Hence, a transmission percentage of a light transmissive region is significantly increased while a touch function of the light transmissive region is ensured to be normal. Further, the first portion A of the touch electrodes 31 disposed correspondingly to the light transmissive region 11 is disposed above the array traces of the TFT array layer 40. Hence, an impact of the first portion A on the transmission percentage of the light transmissive region 11 is maximally decreased. The transmission percentage of the light transmissive region 11 of the OLED display device is finally effectively increased. A camera under panel (CUP) technology is facilitated to be achieved, and a full screen design is facilitated to be realized.

In summary, the light emitting functional layer of the OLED display device of the present disclosure includes the light emitting points arranged in the array inside the light transmissive region. Each light emitting point includes the corresponding light emitting units arranged in the array. The touch layer includes the touch electrodes arranged in the array. The touch electrodes disposed correspondingly to the light transmissive region include the first portion. The first portion includes the sensing blocks and the sensing traces arranged in the array. Adjacent two of the sensing blocks in the same row of the sensing blocks are connected to each other through the at least one of the sensing traces. Adjacent two of the sensing blocks in the same column of the sensing blocks are connected to each other through the at least one of the sensing traces. Each sensing block is disposed above the corresponding light emitting point. Each sensing block has the corresponding grid structure. The corresponding projection of each sensing block in the vertical direction is located outside the corresponding light emitting units of the corresponding light emitting point. The present disclosure can increase the transmission percentage of the light transmissive region while ensuring that the touch function of the light transmissive region is normal.

To persons skilled in the art, in accordance with the technical solutions and technical ideas of the present disclosure, various changes and modifications may be made to the description above. All these changes and modifications are within the protection scope of the claims of the present disclosure.

What is claimed is:

1. An organic light-emitting diode (OLED) display device, comprising: a substrate, a light emitting functional layer, and a touch layer disposed in sequence;
   wherein the substrate comprises a light transmissive region and a display region adjacent to the light transmissive region; wherein the light emitting functional layer comprises a plurality of light emitting points arranged in an array inside the light transmissive region, and each light emitting point comprises a plurality of corresponding light emitting units arranged in an array; wherein the touch layer comprises a plurality of touch electrodes arranged in an array; and
   wherein the touch electrodes comprise a plurality of transmitting electrodes and a plurality of receiving electrodes alternately arranged in sequence, and each adjacent transmitting electrode and receiving electrode of the transmitting electrodes and the receiving electrodes are spaced apart from each other; and
   wherein the touch electrodes disposed correspondingly to the light transmissive region comprise a first portion; wherein the first portion comprises a plurality of sensing blocks and a plurality of sensing traces arranged in an array inside the light transmissive region; wherein adjacent two of the sensing blocks in a same row of the sensing blocks are connected to each other through at least one of the sensing traces; wherein adjacent two of the sensing blocks in a same column of the sensing blocks are connected to each other through at least one of the sensing traces; and wherein each sensing block is disposed above the corresponding light emitting point, each sensing block has a corresponding grid structure, and a corresponding projection of each sensing block in a vertical direction is located outside the corresponding light emitting units of the corresponding light emitting point.

2. The OLED display device of claim 1, wherein in adjacent two of the touch electrodes disposed correspondingly to the light transmissive region, the sensing blocks in the first portion of one of the adjacent two of the touch electrodes closest to the sensing blocks of another of the adjacent two of the touch electrodes are disposed in one-to-one correspondence with the sensing blocks in the first portion of the another of the adjacent two of the touch electrodes closest to the sensing blocks of the one of the adjacent two of the touch electrodes, and correspondingly disposed two of the sensing blocks are located above a same one of the light emitting points.

3. The OLED display device of claim 1, wherein in adjacent two of the touch electrodes disposed correspondingly to the light transmissive region, the corresponding first portion of each of the adjacent two of the touch electrodes is provided with a plurality of corresponding extensions close to a corresponding edge set of corresponding another of the adjacent two of the touch electrodes; wherein a corresponding end of each extension is connected to a corresponding one of the sensing blocks, and corresponding another end of each extension extends in a direction away from the corresponding first portion of the corresponding one of the adjacent two of the touch electrodes where each extension is located; wherein each extension includes a plurality of corresponding parallel spaced extension traces; wherein the corresponding extension traces of each extension have different lengths; wherein the corresponding extensions of the corresponding first portion of each of the adjacent two of the touch electrodes are in one-to-one correspondence with the corresponding extensions of the corresponding first portion of the corresponding another of the adjacent two of the touch electrodes; and wherein the extension traces of one of two corresponding extensions are disposed correspondingly opposite to the extension traces of another of the two corresponding extensions.

4. The OLED display device of claim 3, wherein the one of the sensing blocks has a grid line having a width smaller than a width of one of the corresponding at least one of the sensing traces, and one of the corresponding extension traces has a width same as the width of the one of the corresponding at least one of the sensing traces.

5. The OLED display device of claim 3, wherein an angle between a row direction of the corresponding light emitting units of each light emitting point and a row direction of the sensing blocks in the first portion is 45°;
   the row direction of the corresponding light emitting units of each light emitting point is same as a row direction of the touch electrodes;
   an extending direction of each sensing trace is same as a corresponding direction of the sensing blocks in the first portion, wherein the corresponding direction of the sensing blocks is a row direction or a column direction; and
   an extending direction of each extension trace is same as a column direction of the sensing blocks in the first portion.

6. The OLED display device of claim 1, wherein the touch electrodes disposed correspondingly to the light transmissive region further comprises a second portion located inside the display region and is connected to the first portion; and wherein the second portion has a plurality of first openings arranged in an array.

7. The OLED display device of claim 1, wherein all of a plurality of corresponding edge sets of the touch electrodes located outside the light transmissive region have a plurality of corresponding zigzag structures; and wherein outside the light transmissive region, the corresponding edge sets of any adjacent two of the touch electrodes match each other.

8. The OLED display device of claim 1, wherein each of the touch electrodes except the touch electrodes disposed correspondingly to the light transmissive region has a plurality of corresponding second openings arranged in an array.

9. The OLED display device of claim 1, further comprising: a thin film transistor (TFT) array layer disposed between the light emitting functional layer and the substrate, and a thin film encapsulation layer disposed between the light emitting functional layer and the touch layer.

10. The OLED display device of claim 9, wherein the TFT array layer comprises a plurality of array traces, and the first portion is located above the array traces.

* * * * *